United States Patent
Ueda

(10) Patent No.: US 11,821,090 B2
(45) Date of Patent: Nov. 21, 2023

(54) METHOD OF MANUFACTURING CERAMIC ELECTRONIC COMPONENT

(71) Applicant: Murata Manufacturing Co., Ltd., Kyoto-fu (JP)

(72) Inventor: Yoshinori Ueda, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 468 days.

(21) Appl. No.: 16/167,297

(22) Filed: Oct. 22, 2018

(65) Prior Publication Data

US 2019/0055653 A1 Feb. 21, 2019

Related U.S. Application Data

(63) Continuation of application No. PCT/JP2017/014446, filed on Apr. 7, 2017.

(30) Foreign Application Priority Data

Apr. 26, 2016 (JP) .................................. 2016-087742

(51) Int. Cl.
*C23C 18/18* (2006.01)
*C23C 18/16* (2006.01)
(Continued)

(52) U.S. Cl.
CPC .......... *C23C 18/18* (2013.01); *C23C 18/1608* (2013.01); *C23C 18/1612* (2013.01);
(Continued)

(58) Field of Classification Search
CPC . C23C 18/18; C23C 18/1608; C23C 18/1612; C23C 18/1879; C23C 18/31;
(Continued)

(56) References Cited

U.S. PATENT DOCUMENTS

| | | | | |
|---|---|---|---|---|
| 5,378,297 A | * | 1/1995 | Chang | H01F 17/04 156/244.15 |
| 5,618,611 A | * | 4/1997 | Jin | C04B 41/009 428/209 |

(Continued)

FOREIGN PATENT DOCUMENTS

| | | |
|---|---|---|
| CN | 103030439 A | 4/2013 |
| JP | S60149783 A | 8/1985 |

(Continued)

OTHER PUBLICATIONS

Morita, JP S63-085078, machine translation, originally published 1988, p. 1-4 (Year: 1988).*

(Continued)

*Primary Examiner* — Gordon Baldwin
*Assistant Examiner* — Christina D McClure
(74) *Attorney, Agent, or Firm* — Studebaker & Brackett PC

(57) ABSTRACT

A manufacturing method that enables an electrode to be formed on a specific portion of a surface of a sintered ceramic body by a simple technique. A method of manufacturing a ceramic electronic component includes preparing a sintered ceramic body that contains a metal oxide, and forming low-resistance portions that is formed by reducing the resistance of portions of the ceramic body by radiating laser onto electrode-formation regions of surfaces of the ceramic body. The method further includes causing a catalytic metal to selectively adhere to the low-resistance portions by immersing the ceramic body, in which the low-resistance portions have been formed, in a catalytic metal substitution treatment solution, and forming a plating layer that serves as an electrode onto the low-resistance portions by performing electroless plating on the ceramic body to which the catalytic metal has adhered.

20 Claims, 8 Drawing Sheets

(51) Int. Cl.
  *H01F 17/00* (2006.01)
  *H01F 41/04* (2006.01)
  *H05K 3/18* (2006.01)
  *H01F 17/04* (2006.01)
  *C23C 18/31* (2006.01)
  *H01F 27/29* (2006.01)
  *H01G 4/12* (2006.01)
  *H05K 1/03* (2006.01)
  *C23C 18/32* (2006.01)
  *H05K 1/16* (2006.01)
  *H01G 4/30* (2006.01)

(52) U.S. Cl.
  CPC .......... *C23C 18/1879* (2013.01); *C23C 18/31* (2013.01); *H01F 17/0033* (2013.01); *H01F 17/045* (2013.01); *H01F 27/29* (2013.01); *H01F 41/04* (2013.01); *H01F 41/046* (2013.01); *H05K 3/18* (2013.01); *H05K 3/181* (2013.01); *C23C 18/32* (2013.01); *H01F 17/0013* (2013.01); *H01G 4/12* (2013.01); *H01G 4/30* (2013.01); *H05K 1/0306* (2013.01); *H05K 1/165* (2013.01)

(58) Field of Classification Search
  CPC ... C23C 18/32; H01F 17/0033; H01F 17/045; H01F 17/0013; H01F 27/29; H01F 41/04; H01F 41/046; H05K 3/18; H05K 3/181; H05K 1/0306; H05K 1/165; H01G 4/12; H01G 4/30
  See application file for complete search history.

(56) References Cited

U.S. PATENT DOCUMENTS

2007/0066081 A1* 3/2007 Cheng ............... H01L 21/76874
  438/758
2007/0184654 A1* 8/2007 Akram .............. H01L 21/76898
  438/675
2008/0143468 A1* 6/2008 Yokoyama .......... H01F 17/0033
  336/200
2016/0067996 A1   3/2016 Xu et al.

FOREIGN PATENT DOCUMENTS

| JP | S63-035481 A | 2/1988 |
| JP | S63-085078 A | 4/1988 |
| JP | H02190474 A | 7/1990 |
| JP | H06-024878 A | 2/1994 |
| JP | H09-020580 A | 1/1997 |
| JP | H11-176685 A | 7/1999 |
| JP | 2000-223342 A | 8/2000 |
| JP | 2000-243629 A | 9/2000 |
| JP | 2004-040084 A | 2/2004 |
| JP | 2004-088040 A | 3/2004 |

OTHER PUBLICATIONS

Hirsch, Immersion Plating, 2000, p. 436-439 (Year: 2000).*
An Office Action; "Notification of Reasons for Refusal," Mailed by the Japanese Patent Office dated Oct. 1, 2019, which corresponds to Japanese Patent Application No. 2018-514230 and is related to U.S. Appl. No. 16/167,297; with English language translation.
International Search Report issued in PCT/JP2017/014446; dated May 23, 2017.
International Preliminary Report on Patentability and Written Opinion issued in PCT/JP2017/014446; dated Oct. 30, 2018.
An Office Action mailed by the China National Intellectual Property Administration dated Dec. 11, 2019, which corresponds to Chinese Patent Application No. 201780025460.1 and is related to U.S. Appl. No. 16/167,297 with English language translation.

* cited by examiner

FIG. 4A LASER PROCESSING INITIAL STATE
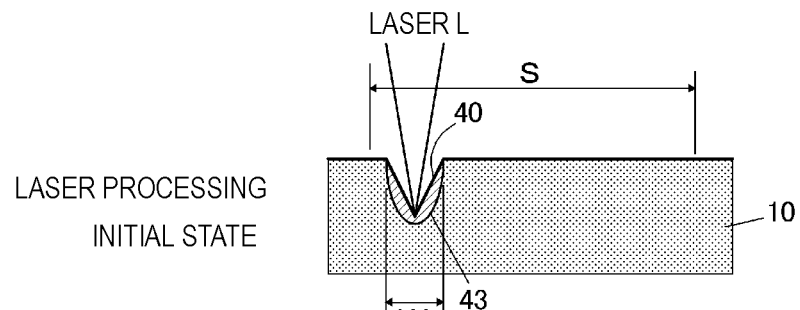
FIG. 4B LASER PROCESSING FINAL STATE
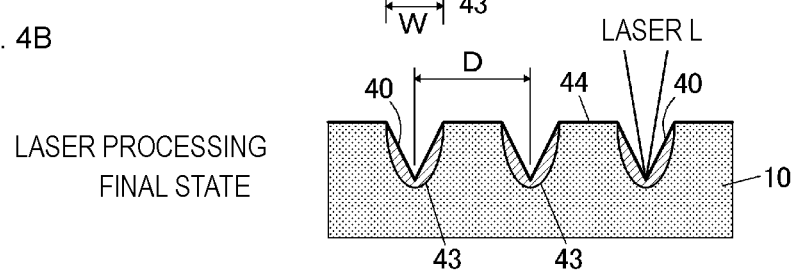
FIG. 4C CATALYST APPLICATION
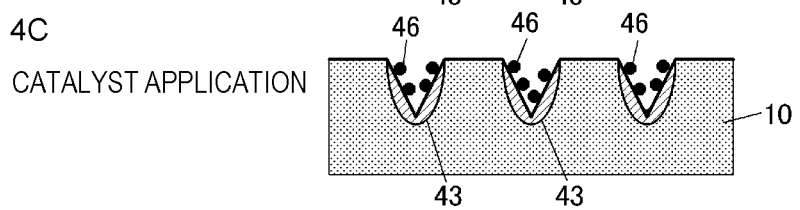
FIG. 4D ELECTROLESS PLATING INITIAL STATE
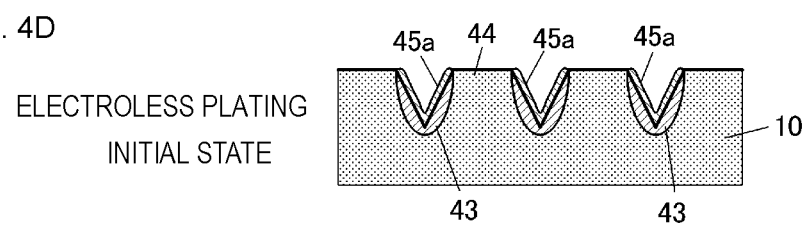
FIG. 4E ELECTROLESS PLATING FINAL STATE
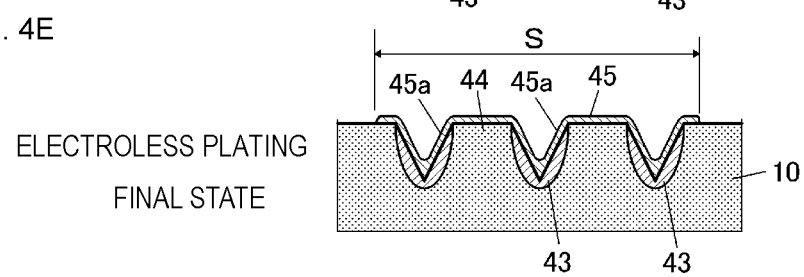

LASER PROCESSING
INITIAL STATE

LASER PROCESSING
FINAL STATE

CATALYST APPLICATION

ELECTROLESS PLATING
INITIAL STATE

ELECTROLESS PLATING
FINAL STATE

METHOD OF MANUFACTURING CERAMIC ELECTRONIC COMPONENT

CROSS-REFERENCE TO RELATED APPLICATIONS

This application claims benefit of priority to International Patent Application No. PCT/JP2017/014446, filed Apr. 7, 2017, and to Japanese Patent Application No. 2016-087742, filed Apr. 26, 2016, the entire contents of each are incorporated herein by reference.

BACKGROUND

Technical Field

The present disclosure relates to a method of manufacturing a ceramic electronic component, and more particularly to formation of an electrode of a ceramic electronic component. Examples of the ceramic electronic component according to the present disclosure include a chip component and a wiring board.

Background Art

In the related art, in a typical method of a forming an outer electrode of a ceramic electronic component, an electrode paste is applied to two end surfaces of a sintered ceramic body and is baked so as to form base electrodes, and then an upper electrode is formed on each of the base electrodes by plating. However, in this method, a step of applying a paste and a step of heating the paste, which is involved in a step of baking the paste, are required for forming a base electrode, and thus, there is a problem in that the manufacturing process becomes complex and that the costs increase.

Another problem is that, when a conductive paste is applied during formation of a base electrode, there is a limitation on the shape into which the conductive paste is applied. For example, when a conductive paste is applied to two end portions of a ceramic body having a rectangular parallelepiped shape by a dip method, the conductive paste is applied not only to the two end surfaces of the ceramic body but also to four side surfaces of the ceramic body, which are adjacent to the end surfaces. Consequently, outer electrodes that are eventually formed are shaped so as to extend to the end surfaces and the four side surfaces, which are adjacent to the end surfaces.

Instead of such an electrode forming method of the related art, Japanese Unexamined Patent Application Publication No. 2004-40084 discloses a method of forming an outer electrode only by plating. In this method, a plurality of end portions of an inner electrode are exposed at an end surface of a ceramic body so as to be close to each other, and a dummy terminal that is called an anchor tab is exposed at the same end surface, at which the end portions of the inner electrode are exposed, so as to be close to the end portions. Then, electroless plating is performed on the ceramic body, so that a plating metal is caused to grow while the end portions of the inner electrode and the anchor tab serve as cores, and an outer electrode is formed.

However, in this method, a plurality of end portions of an inner electrode and an anchor tab need to be exposed so as to be close to one another at a portion of a ceramic body on which an outer electrode is to be formed, and thus, this method has disadvantages in that the manufacturing process becomes complex and that the costs increase. In addition, a surface on which a plating metal is formed is limited to the surface at which the end portions of the inner electrode and the anchor tab are exposed, and thus, an outer electrode cannot be formed on an arbitrary portion.

Japanese Unexamined Patent Application Publication No. 6-24878 discloses a method of forming a plated electrode onto a surface of a ceramic body. In this method, a surface of a ceramic body is etched with an ammonium fluoride solution, and then, catalyst application is performed on the ceramic body by the sensitizer activator method. After that, electroless plating is performed, so that an electrode is formed. However, in the case of trying to form an electrode only a specific portion of a ceramic body by this method, patterning using, for example, a mask or a photoresist needs to be performed, and thus, this method has a disadvantage in that the number of processing steps increases. In particular, there is a disadvantage in that, if a ceramic body has a complex shape, it is difficult to perform patterning on such a ceramic body, so that the costs increase.

In contrast, Japanese Unexamined Patent Application Publication No. 2000-223342, Japanese Unexamined Patent Application Publication No. 2000-243629 and Japanese Unexamined Patent Application Publication No. 11-176685 each disclose a method of forming a coil pattern by forming an electrode over the entire surface of ferrite that forms an inductor and then radiating laser onto the electrode so as to burn off the electrode. It is disclosed that, in this case, the heat of the laser is conducted not only to the electrode but also to the ferrite below the electrode, and part of the ferrite becomes conductive or the resistance of part of the ferrite is reduced as a result of the property thereof being changed (see paragraph [0005] in Japanese Unexamined Patent Application Publication No. 2000-223342, paragraph [0004] in Japanese Unexamined Patent Application Publication No. 2000-243629, and paragraph [0005] in Japanese Unexamined Patent Application Publication No. 11-176685). However, these documents only disclose that an electrode is burned off by laser radiation, and in addition, it is described that heat of laser adversely affects the characteristics of an inductor.

SUMMARY

Accordingly, the present disclosure provides a manufacturing method that enables an electrode to be formed on a specific portion of a surface of a ceramic body by a simple technique.

For example, the present disclosure provides a method of manufacturing a ceramic electronic component. The method includes the steps of A: preparing a sintered ceramic body that contains a metal oxide, B: forming a low-resistance portion that is formed by reducing a resistance of a portion of the ceramic body by performing local heating on an electrode-formation region of a surface of the ceramic body, C: causing a catalytic metal to adhere to the low-resistance portion by immersing the ceramic body, in which the low-resistance portion has been formed, in a catalytic metal substitution treatment solution, and D: forming a plating layer that serves as an electrode onto the low-resistance portion by performing electroless plating on the ceramic body to which the catalytic metal has adhered.

In the present disclosure, a surface of electrode-formation region of a sintered ceramic body is locally heated, so that the resistance of the heated portion is reduced, or the heated portion becomes conductive. It is assumed that some of metal oxides contained in the ceramic body are reduced as a result of local heating and that low-resistance portions are formed. Then, when the ceramic body, in which the low-resistance portion have been formed, is immersed in a catalytic metal substitution treatment solution, a catalytic metal contained in the catalytic metal substitution treatment solution substitutes for a metal component of the low-resistance portions, and the catalytic metal selectively adheres to the low-resistance portions. The catalytic metal does not adhere to portions other than the low-resistance portions. Subsequently, when the ceramic body, to which the catalytic metal has adhered, is immersed in a plating solution containing metal ions that form an electrode, a plating layer is selectively formed on the low-resistance portions. In other words, since the catalytic metal that serves as a precipitation core of a plating metal has already adhered to the low-resistance portions of the ceramic body, the plating metal is reduced and precipitated onto the low-resistance portions by the catalytic action of the catalytic metal. The plating layer grows while the plating metal that has been precipitated on the low-resistance portions serves as the core, so that an electrode that covers the entire electrode-formation region can be efficiently formed.

As an electrode forming method using electroless plating, for example, a method may be considered in which electroless plating is performed on a ceramic body in which low-resistance portions have been formed. However, a plating layer will not be formed on the low-resistance portions by this method. This is because the activity in the low-resistance portions is low, so that the plating metal is not reduced or precipitated. In contrast, there is a method in which a ceramic body in which low-resistance portions are not formed is immersed in a catalytic metal substitution treatment solution, and then electroless plating is performed on the ceramic body. However, a plating layer cannot be selectively formed on a specific portion of the ceramic body by this method. In the present disclosure, electroless plating is performed on a ceramic body in which low-resistance portions have been formed after catalyst application has been performed on the ceramic body, and thus, a plating layer can be formed only on portions where the low-resistance portions have been formed (electrode-formation regions).

As a local heating method, there are various methods including local heating using laser radiation, local heating using electron-beam radiation, and local heating using an image furnace. Laser, an electron beam, or heat rays can be accurately radiated onto a specific region by either method, and thus, these methods have an advantage in that patterning can be performed without using a mask. In particular, laser radiation is advantageous in that a radiation position of laser with respect to a ceramic body can be quickly changed.

In the case where laser is used as a method of local heating, since laser energy is concentrated at a narrow region, a portion of a ceramic body melts and solidifies. For example, linear laser-irradiated marks or dot laser-irradiated marks are formed on a surface of the ceramic body, and low-resistance portions are formed in the vicinity of these marks. The depths and the widths of the laser-irradiated marks and the low-resistance portions can be adjusted by adjusting the radiation energy of the laser (wave length, output, and so forth). A plating metal precipitated on the low-resistance portions becomes fixed along inner walls of the recessed laser-irradiated marks, and thus, by its anchor effect, the fixing strength of the plating metal (electrode) with respect to the ceramic body can be increased.

The laser may be densely radiated onto the electrode-formation regions such that the low-resistance portions are formed almost without any gap therebetween. In this case, the low-resistance portions are formed so as to be continuous with one another. Thus, the plating metal promptly precipitates and grows, and the time taken for plating can be reduced. Note that the wording "densely radiated" refers to a situation in which the distance between the centers of laser radiation spots is equal to or smaller than the width of each of the low-resistance portions. In other words, when the distance between the centers of laser radiation spots and the diameter of each of the spots (the width of each of the low-resistance portions) are respectively denoted by reference signs D and W, a relationship of $D \leq W$ is satisfied.

In addition, a plurality of low-resistance portions may be dispersedly formed in an electrode-formation region by dispersedly radiating laser onto positions in the electrode-formation region that are spaced apart from one another. In this case, a plating metal grows while plating metal portions that are individually precipitated onto the low-resistance portions serve as cores, and by continuously performing the plating until the plating metal portions are connected to each other, a continuous electrode can be formed. Here, the wording "dispersedly radiated" refers to a situation in which the distance between the centers of laser radiation spots is larger than the width of each of the low-resistance portions. In other words, when the distance between the centers of laser radiation spots and the diameter of each of the spots (the width of each of the low-resistance portions) are respectively denoted by reference signs D and W, a relationship of $D > W$ is satisfied. The advantage of plating is that, if a plating metal is precipitated onto a portion, the plating metal rapidly grows to the surroundings while the portion serves as a core. After plating metal portions have been precipitated on a plurality of dispersed low-resistance portions by using the above advantage, the plating metal also grows to regions between the low-resistance portions while the plating metal portions serve as cores, and thus, a continuous electrode extending over the entire electrode-formation region can be formed. Thus, a favorable electrode can be formed without densely radiating the laser, and the time taken for laser processing can be reduced.

A representative example of a ceramic material whose resistance can be reduced or that can become conductive by being irradiated with laser is ferrite. Ferrite is a ceramic containing an iron oxide as a main component, and for example, there are spinel ferrite, hexagonal ferrite, garnet ferrite, and the like. When laser is radiated onto ferrite, the temperature in the irradiated portion becomes high, and an outer-layer portion of the ferrite having an insulating property is altered so as to have electrical conductivity. In other words, a low-resistance portion is formed. Note that it is assumed that a similar low-resistance portion can be formed even if electron beams or heat rays obtained by an image furnace are radiated instead of laser.

The low-resistance portion may include a reduced layer that is formed as a result of a metal oxides contained in the ceramic body being partly reduced. As a result of the metal oxide being partly reduced, the metal oxide becomes conductive or semiconductive. This facilitates substitution of a catalytic metal for the reduced metal, and the adhesive property of the catalytic metal is improved. Note that a portion of or the entire outer layer of the reduced layer may be covered with a reoxidized layer. In the case where a reoxidized layer is formed, the reoxidized layer has an effect of suppressing oxidation of the reduced layer at a lower layer and an effect of suppressing aging of the reoxidized layer itself. Note that the reoxidized layer is formed in a thin film-like shape of the order of nm.

As the catalytic metal substitution treatment solution used in the present disclosure, for example, a Pd substitution treatment solution, an Ag substitution treatment solution, or a Cu substitution treatment solution can be used. For example, when electroless Ni plating is performed, a Pd substitution treatment solution or an Ag substitution treatment solution can be used, and when electroless Cu plating is performed, any one of a Pd substitution treatment solution, an Ag substitution treatment solution, and a Cu substitution treatment solution can be used. In particular, Pd is less likely to be oxidized than Ag and Cu and has a strong catalytic action, and thus, a Pd substitution treatment solution is most desirable.

In catalyst application and electroless plating, a large number of ceramic bodies can be processed at the same time, and thus, an electrode forming method that is favorable for mass production can be achieved. Complex steps including application and baking of a conductive paste such as those of the related art are not necessary, and an electrode forming process is simplified. In addition, since it is not necessary to cause a plurality of inner electrodes and an anchor tab to be exposed so as to be close to one another at an end surface of a ceramic body as in Japanese Unexamined Patent Application Publication No. 2004-40084, there is no limitation on the shape of an electrode. In addition, the manufacturing process can be simplified, and the costs can be reduced. Furthermore, in electroless plating, a media such as that used in electrolytic plating is not used. In the case where electrolytic plating is employed, if a portion on which an electrode is to be formed is very small or is located at a deep position, the portion is less likely to be brought into contact with a media, and thus, there is a possibility that a plating layer will not be formed or that variations in the thickness of a plating layer will occur. Since a media is not used in electroless plating, there is no shape limitation, and a plating layer having a uniform thickness can be formed.

The electrode according to the present disclosure is not limited to an outer electrode and may be any electrode as long as the electrode is formed on a surface of a ceramic body. For example, the electrode may be a coil-shaped electrode that is formed on a winding core portion of a ferrite core or may be a wiring electrode that is formed on a ceramic substrate. The ceramic substrate is not limited to being made of a single ceramic material, and only an outer-layer portion on which a wiring electrode is to be formed may be formed of a ceramic body containing a metal oxide.

According to the present disclosure, an electrode can be formed on an arbitrary portion of a ceramic body. For example, irregular electrodes may be easily formed, that is, outer electrodes (each having an L-shape when viewed from the side) may be easily formed on two end surfaces of a ceramic body having a rectangular parallelepiped shape and one side surface of the ceramic body that is adjacent to the end surfaces, or a plurality of outer electrodes may be easily formed on one side surface of the ceramic body so as to be spaced apart from each other. It is only necessary for local heating to be performed on an outer-layer portion of a ceramic body, and thus, local heating does not substantially affect the characteristics of a ceramic electronic component (e.g., an inductor).

The present disclosure can also be applied to, for example, a wire-wound coil component. In other words, the ceramic body is a ferrite core that includes flange portions that are formed at opposite ends of the ferrite core and a winding core portion that is formed between the flange portions. A coil-shaped low-resistance portion is formed on a winding core portion of the ferrite core by, for example, laser processing, and low-resistance portions each of which has the shape of a terminal electrode are formed on the flange portions of the core by, for example, laser processing. The coil-shaped low-resistance portion is connected to the low-resistance portions, each of which has the shape of a terminal electrode. When electroless plating is performed on the ferrite core after the ferrite core has been immersed in a catalytic metal substitution treatment solution, a plated electrode is continuously formed onto the coil-shaped low-resistance portion and the low-resistance portions, each of which has the shape of a terminal electrode. In this case, since both the coil portion and the terminal electrode portions can be formed by, for example, laser processing, the manufacturing process is further simplified. Note that the thickness of the electrode of the coil portion can be set to be larger than that of the outer electrodes by a method of, for example, adjusting the intensity of the laser.

The ceramic body may be a ferrite core that includes flange portions that are formed at opposite ends of the ferrite core and a winding core portion that is formed between the flange portions, and a plurality of low-resistance portions may be formed only on surfaces of the flange portions. Terminal electrodes each of which is made of a plating metal are formed on the low-resistance portions of the flange portions. A wire is wound around the peripheral surface of the winding core portion, and two end portions of the wire are connected to the terminal electrodes. In this case, the winding portion is formed of a metal wire, and thus, the magnetic efficiency is high. Each of the terminal electrodes can be formed as a thin plated electrode according to the present disclosure, the eddy-current loss is small. Therefore, an inductor having a high Q-value can be fabricated.

The present disclosure can also be applied to formation of a wiring electrode of a ceramic wiring board. In other words, a low-resistance portion is formed on a surface of a ceramic wiring board by local heating, and then, catalyst application is performed. After that, electroless plating is performed, so that a wiring electrode formed of a plating layer can be formed on the low-resistance portion. By this method, a wiring electrode can be formed without performing patterning, and thus, this method can be used for low-volume, high-variety production of wiring boards.

As described above, according to the present disclosure, a low-resistance portion is formed by locally heating an electrode-formation region of a sintered ceramic body, and the ceramic body is immersed in a catalytic metal substitution treatment solution. Then, electroless plating is performed on the ceramic body such that a plating metal is caused to be selectively precipitated onto the low-resistance portion. Therefore, an electrode can be formed by a simple method without performing complex patterning processing. In addition, an electrode can be formed on an arbitrary portion as long as the portion can be locally heated, and thus, even if an electronic component has a complex shape, an electrode can be easily formed.

BRIEF DESCRIPTION OF THE DRAWINGS

FIGS. 4A-4E are cross-sectional views illustrating an example of a process of forming an electrode;

DETAILED DESCRIPTION

Figure 1:
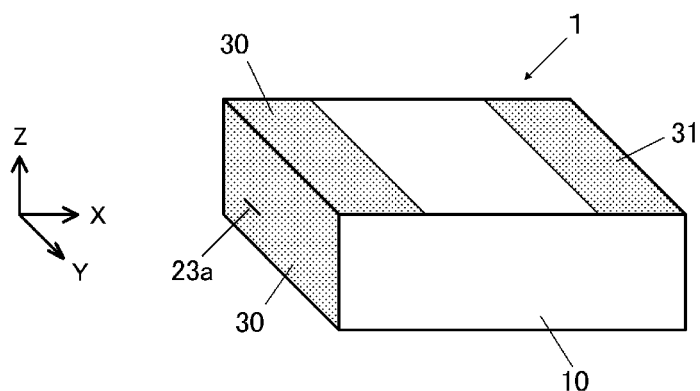
FIG. 1 is a perspective view of a ceramic electronic component according to a first embodiment of the present disclosure.

FIG. 1 illustrates a chip inductor 1 that is an example of a ceramic electronic component according to the present disclosure. The inductor 1 includes a sintered ceramic body 10, and outer electrodes 30 and 31 are formed on opposite end portions of the ceramic body 10 in the lengthwise direction of the ceramic body 10. As illustrated in FIG. 1, the shape of the inductor 1 according to the present embodiment is a rectangular parallelepiped shape in which the dimension in an X-axis direction is larger than the dimension in a Y-axis direction and the dimension in a Z-axis direction.

Figure 2:
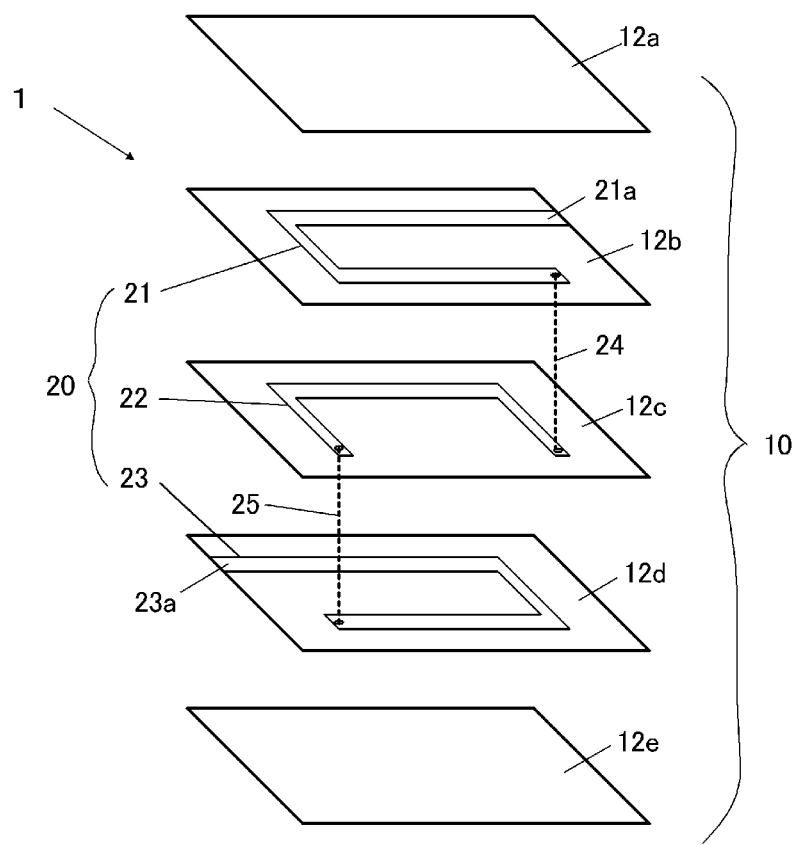
FIG. 2 is an exploded perspective view of the ceramic electronic component illustrated in FIG. 1.

As illustrated in FIG. 2, the ceramic body 10 is obtained by laminating and sintering insulator layers 12a to 12e together, each of the insulator layers 12a to 12e containing, for example, Ni—Zn-based ferrite or Ni—Cu—Zn-based ferrite as a main material. The insulator layers 12a to 12e are laminated on top of one another in this order in a top-bottom direction (Z-axis direction). Coil conductors 21 to 23 that forms an inner electrode 20 are formed on the intermediate insulator layers 12b to 12d excluding the insulator layers 12a and 12e, which are positioned at either end in the top-bottom direction. These three coil conductors 21 to 23 are connected to one another by via conductors 24 and 25 and formed in a helical shape when seen as a whole. The coil conductors 21 to 23 and the via conductors 24 and 25 are made of an electrically conductive material such as Au, Ag, Pd, Cu or Ni. An end portion (an extended portion) 21a of the coil conductor 21 is exposed at a first end surface of the ceramic body 10 in the X-axis direction, and an end portion (an extended portion) 23a of the coil conductor 23 is exposed at a second end surface of the ceramic body 10 in the X-axis direction. Note that, in the present embodiment, although a case has been described in which the coil conductors 21 to 23 form a coil that is wound in two turns, the number of turns is arbitrary, and the shapes of the coil conductors and the number of the insulator layers can also be arbitrarily selected. In addition, the number of the insulator layers 12a and 12e each of which does not include a coil conductor is also arbitrary.

As illustrated in FIG. 1, each of the outer electrodes 30 and 31 is formed in an L-shape when viewed from the side so as to cover one of the end surfaces of the ceramic body 10 in the X-axis direction and a portion of the top surface (which becomes the bottom surface at the time of mounting the ceramic body 10) of the ceramic body 10. In other words, when the ceramic body 10 is viewed in the Y direction, the outer electrodes 30 and 31 are each formed in an L-shape. The outer electrode 30 is connected to the extended portion 23a of the coil conductor 23, and the outer electrode 31 is connected to the extended portion 21a of the coil conductor 21. Note that the outer electrodes 30 and 31 are formed by electroless plating as will be described later, and as the material of the outer electrodes 30 and 31, for example, Cu, Au, Ag, Pd, Ni, Sn, or the like is used. Note that each of the outer electrodes 30 and 31 may be made of a plating metal and multilayered.

Figure 3A:
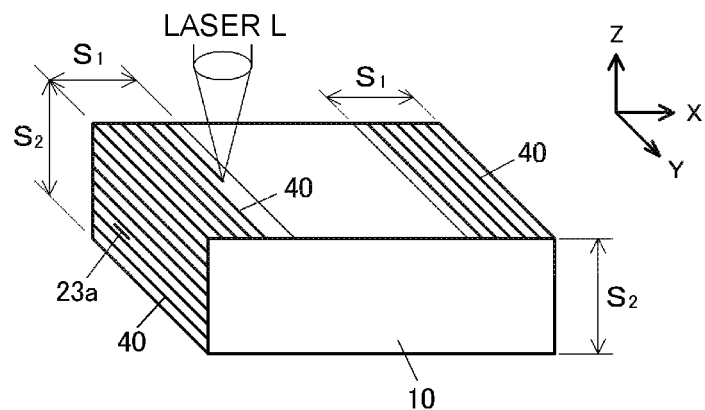
FIGS. 3A-3C are perspective views each illustrating a state in which laser is radiated onto outer-electrode-formation regions.
Figure 3B:
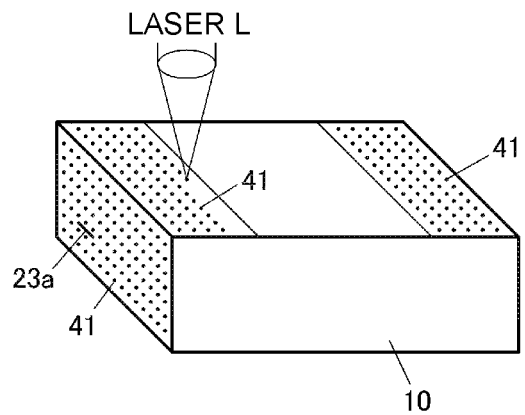
Figure 3C:
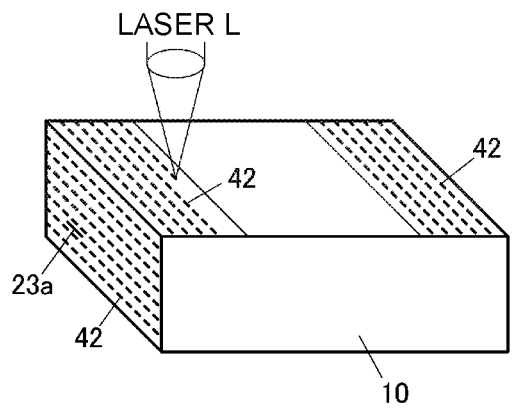

FIGS. 3A-3C each illustrate a state in which laser L is radiated onto outer-electrode-formation regions S1 and S2 before the outer electrodes 30 and 31 are formed onto the ceramic body 10. FIG. 3A illustrates a case in which the laser L is caused to scan along the Y-axis direction while being continuously radiated (or a case in which the ceramic body 10 is moved in the Y-axis direction). Note that the direction in which the laser L is caused to scan is arbitrary, and the laser L may be caused to scan in the X-axis direction (or the Z-axis direction) or may be caused to scan in a zigzag manner or in a circular manner. By performing radiation of the laser L, a large number of linear laser-irradiated marks 40 are formed on the surfaces of the ceramic body 10. Note that, although FIG. 3A illustrates a case in which the linear laser-irradiated marks 40 are formed so as to be spaced apart from one another in the X-axis direction, the laser-irradiated marks 40 may be densely formed so as to be overlap one another. FIG. 3B illustrates a state in which the laser L is radiated in a dotted manner. In this case, a large number of dot laser-irradiated marks 41 are dispersedly formed on the surfaces of the ceramic body 10. FIG. 3C illustrates a case in which the laser L is radiated in a dashed-line manner. In this case, a large number of laser-irradiated marks 42 are dispersedly formed in a dashed-line manner on the surfaces of the ceramic body 10. In any of the above cases, it is desirable that the laser L be uniformly radiated onto the entire outer-electrode-formation regions S1 and S2.

FIGS. 4A-4E schematically illustrate an example of a process of forming an electrode. In particular, FIGS. 4A-4E illustrate a case in which the lase L is radiated onto positions in an electrode-formation region S that are spaced apart from one another by a predetermined distance D.

FIG. 4A illustrates a state in which the laser has been radiated to the electrode-formation region S of a surface of the ceramic body 10, and as a result, the laser-irradiated marks 40 each of which is V-shaped or U-shaped in cross-section have been formed on the surface of the ceramic body 10. Note that FIG. 4A illustrates a case in which the laser L is converged to one point. However, in practice, a spot onto which the laser L is radiated may have a certain area. The laser-irradiated marks 40 are marks formed as a result of outer-layer portions of the ceramic body 10 melting and solidifying by being irradiated with the laser. Energy is highest at the center of the spot, and thus, a ceramic material of a portion corresponding to the center of the spot is likely to be altered, so that each of the laser-irradiated marks 40 is substantially V-shaped or substantially U-shaped in cross section. In the peripheral portions of the laser-irradiated marks 40 including inner wall surfaces of the laser-irradiated marks 40, an insulating material (ferrite) contained in the ceramic body is altered, and conductive portions each having a resistance lower than that of the insulating material or low-resistance portions 43 are formed. The low-resistance portions 43 are formed as a result of some of metal oxides contained in the ferrite being reduced, and it is assumed that a metal or the semiconductor is present in the low-resistance portions 43. More specifically, if the ceramic body 10 contains Ni—Zn-based ferrite, there is a probability that at least one type of metal among Fe, Ni, and Zn contained in the ferrite will be reduced by laser radiation. If the ceramic body 10 contains Ni—Cu—Zn-based ferrite, there is a probability that at least one type of metal among Fe, Cu, Ni and Zn contained in the ferrite will be reduced. The depth and the width of each of the low-resistance portions 43 can be changed by changing the radiation energy of the laser, the irradiation range, and the like.

FIG. 4B illustrates a state in which the plurality of laser-irradiated marks 40 have been formed in the electrode-formation region S so as to be spaced apart from one another by the distance D by repeatedly performing the laser radiation. In this case, the distance D between the centers of laser radiation spots is wider than a width W of each of the low-resistance portions 43 (e.g., the average value of the diameters of the low-resistance portions 43), and thus, insulating regions 44 other than the low-resistance portions are present between the laser-irradiated marks 40. The regions 44 are regions through which the original insulating material contained in the ceramic body is exposed without being altered. Note that, in the case where ceramic powder produced as a result of performing the laser radiation is deposited on the surfaces of the ceramic body, the ceramic powder may be removed by subjecting the ceramic body to, for example, ultrasonic cleaning.

FIG. 4C illustrates a state in which a catalytic metal 46 has adhered to the low-resistance portions 43 by immersing the ceramic body 10, in which the low-resistance portions 43 have been formed by the laser radiation as described above, in a catalytic metal substitution treatment solution. The catalytic metal 46 has substituted for a metal contained in the low-resistance portions 43, and the catalytic metal 46 has adhered to the low-resistance portions 43. Note that the catalytic metal 46 does not adhere to portions other than the low-resistance portions 43. In order to describe the principle, FIG. 4C illustrates a state in which the particulate catalytic metal 46 has adhered to the surfaces of the low-resistance portions 43. However, in practice, it is assumed that the catalytic metal 46 has substituted for the metal or part of the semiconductor contained in the low-resistance portions 43. Note that it is preferable that the ceramic body 10 be washed with water after being immersed in the catalytic metal substitution treatment solution.

FIG. 4D illustrates the initial state of electroless plating performed on the ceramic body 10, to which the catalytic metal 46 has adhered, by immersing the ceramic body 10 in a plating solution containing metal ions that form an electrode. Since the catalytic metal 46 that serves as a precipitation core of a plating metal has adhered to the low-resistance portions 43 of the ceramic body 10, plating metal portions 45a are reduced and precipitated onto the low-resistance portions 43 by the catalytic action of the catalytic metal 46, and the plating layers 45a are selectively formed on the low-resistance portions 43. At this stage, the plating metal portions 45a have not yet been precipitated onto the insulating regions 44 between the low-resistance portions 43. In other words, a continuous electrode has not yet been formed.

FIG. 4E illustrates the final stage of the electroless plating that has been performed. By continuously performing the plating, the plating metal portions 45a, which have been precipitated on the low-resistance portions 43, grow to the surroundings as cores and spread over the insulating regions 44 between the low-resistance portions 43. By continuously performing the plating until the adjacent plating metal portions 45a are connected to each other, a continuous electrode 45 can be formed. Since a catalytic metal does not adhere to regions outside the low-resistance portions 43, to which the laser has been radiated, the growth rate of the plating metal portions in these regions is slower than that in the low-resistance portions 43, and the plating metal portions can be caused to selectively grow in the electrode-formation region without strictly controlling the length of time over which the plating is performed. By controlling the length of time over which the plating is performed, the temperature, or the like, the length of time for forming the electrode and the thickness of the electrode can be controlled.

Note that an electrode having a multilayer structure can be formed by performing an additional plating on the electrode 45 formed through the first plating. In this case, since the electrode 45 that serves as a base has already been formed, the additional plating may be performed for a short period of time. An upper-layer electrode may be made of a metal different from that of the base electrode 45. In addition, a method of forming the upper-layer electrode is not limited to electroless plating, and electrolytic plating may be employed.

Example

An example in which an electrode was actually formed will be described below.
(1) Laser was radiated to a sintered ceramic body made of Ni—Cu—Zn-based ferrite in such a manner as to perform a reciprocating scanning motion. Although processing conditions are as follows, the wavelength may be set within a range of 532 nm to 10,620 nm. The radiation interval refers to the distance between the center of the laser spot on a forward-movement path of the laser and the center of the laser spot on a backward-movement path of the laser that performs a reciprocating scanning motion.

TABLE 1

| [Laser Processing Conditions] | |
| --- | --- |
| Wavelength | 1,064 nm (YVO4) |
| Output | 14 A |
| Scanning Speed | 200 mm/s |
| Q Switch Frequency | 20 kHz |
| Radiation Interval (Pitch) | 30 μm |
| Spot Diameter | 70 μm |
| Energy Density | 1 J/sec |

(2) The ceramic body to which the laser has been radiated was immersed in a Pd substitution treatment solution (PDC10W manufactured by Ishihara Chemical Co., Ltd.) so as to cause Pd, which is a catalytic metal, to adhere to a portion of the ceramic body to which the laser has been radiated. The temperature of the solution was set to 30° C., and the immersion time was set to 3 minutes.
(3) The ceramic body to which Pd has adhered was washed with water, and then electroless Ni plating was performed under the following conditions. More specifically, a plating solution (Nimuden KPR-11 manufactured by C. Uyemura & Co., Ltd.) was used while the temperature of the solution was set to 77° C., and the immersion time was set to 60 minutes. As a result of performing the electroless plating under these conditions, a favorable Ni electrode having an average thickness of 10 µm was formed on a surface of the ceramic body (the portion of the ceramic body to which the laser has been radiated). Note that similar results were obtained also when Ni—Zn-based ferrite was used.

Note that, for comparison, electroless Ni plating was performed on a ceramic body to which laser has been radiated under conditions similar to those mentioned above (without immersing the ceramic body in the Pd substitution treatment solution). In this case, a plating layer was not formed on a portion of the ceramic body to which the laser has been radiated. This is presumably because the activity in the laser radiated portion is low, so that the plating metal is not reduced or precipitated. In contrast, a ceramic body to which laser was not radiated was immersed in the Pd substitution treatment solution, and then electroless Ni plating was performed thereon. Also in this method, a plating layer was not formed. This is presumably because Pd did not adhere to the ceramic body. The effectiveness of the method according to the present disclosure was confirmed by these results.

Evaluation

The valences of Fe, Cu and Zn on a surface of a sample that was obtained by radiating laser onto Ni—Cu—Zn-based ferrite and the valences of Fe, Cu and Zn on a surface of a sample that was obtained by not radiating laser onto Ni—Cu—Zn-based ferrite were evaluated by K-edge X-ray absorption fine structures (XAFS) of Fe, Cu, and Zn measured by using X-ray photoelectron spectroscopy (XPS) and conversion electron yield. As a result of XPS, a metal component was not detected in the outer layer of the sample to which the laser was radiated, and a metal component was detected in a lower layer of the sample. As a result of XAFS, the Cu metal component was detected in an outer-layer portion of the sample to which the laser was radiated. In contrast, as a result of XAFS, a semiconductor component of Fe and an insulating-material component were detected on an outer-layer portion of the sample to which the laser was radiated, whereas the Fe metal component was not detected. It was also found that the ratio of $Fe_2+$ to $Fe_3+$ in a lower layer is larger than that in the whole ceramic body. From the above results, it is surmised that a metal oxide contained in the ferrite was decomposed by heat generated by laser processing and that a metallic element of the ferrite was reduced in the lower layer of the ceramic body, and reoxidation occurred by residual heat in the outer-layer portion of the ceramic body.

Figure 5:
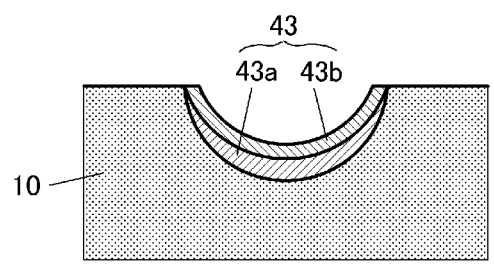
FIG. 5 is an enlarged cross-sectional view of an example of a low-resistance portion.

FIG. 5 illustrates an example of a sectional structure of each of the low-resistance portions 43, which are formed in the manner described above. A reduced layer 43a is formed at a lower layer, and the outer layer thereof is covered with a reoxidized layer 43b that contains a semiconductor and/or an insulating-material component. Each of the low-resistance portions 43 is formed of the reduced layer 43a and the reoxidized layer 43b. Note that the laser radiation is not limited to being performed in an atmosphere and may be performed in a vacuum or in an $N_2$ atmosphere. However, in the case where laser radiation is performed in a vacuum or in an $N_2$ atmosphere, there is a possibility that the reoxidized layer will not be formed.

In the case where the above-mentioned reoxidized layer is formed, the following advantageous effects are conceivable. That is to say, $Fe_3O_4$ forming the reoxidized layer has a property that reoxidation thereof is less likely to advance at normal temperature and has an effect of suppressing oxidation of a reduced layer located at a lower layer and an effect of suppressing aging of the reoxidized layer itself. The reoxidized layer is one type of semiconductor and has a resistance lower than that of ferrite, which is an insulating material. Thus, a plating metal is likely to be precipitated onto the reoxidized layer.

FIGS. 6A-6E illustrate another example of a method of forming an electrode. In particular, FIGS. 6A-6E illustrate a case in which the laser L is densely radiated onto the electrode-formation region. The wording "densely radiated" refers to a situation in which the distance D between the centers of laser radiation spots is equal to or smaller than the width W of each of the low-resistance portions 43 (e.g., the average value of the diameters of the low-resistance portions 43) and refers to a state in which the low-resistance portions 43, which are formed below the adjacent laser-irradiated marks 40, are connected to each other (see FIG. 6B). However, all the low-resistance portions 43 are not necessarily connected to one another. Thus, substantially the entire electrode-formation region of the ceramic body 10 is covered with the low-resistance portions 43.

Figure 6A:
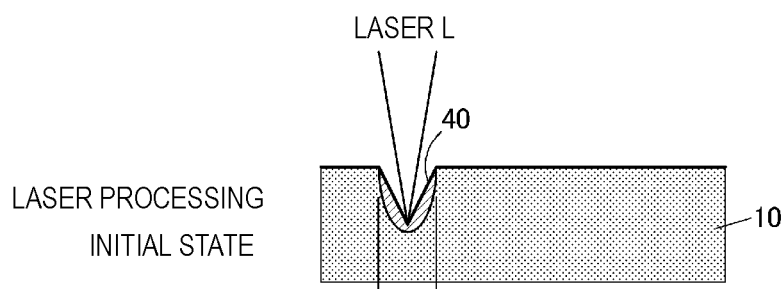
FIGS. 6A-6E are cross-sectional views illustrating another example of a process of forming an electrode.
Figure 6B:
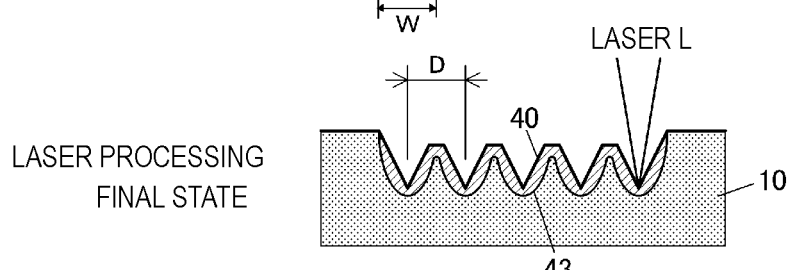
Figure 6C:
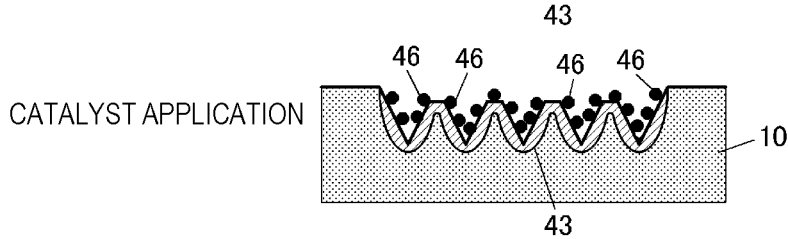

In this case, as illustrated in FIG. 6C, when the ceramic body 10, in which the low-resistance portions 43 have been formed by laser radiation, is immersed in the catalytic metal substitution treatment solution, the catalytic metal 46 substitutes for the metal contained in the low-resistance portions 43, and the catalytic metal 46 adheres to the low-resistance portions 43. Since the low-resistance portions 43 are densely formed, the catalytic metal 46 adheres to the low-resistance portions 43 in a substantially continuous manner. Note that, for ease of understanding the principle, also FIG. 6C illustrates a state in which the particulate catalytic metal 46 has adhered to the surfaces of the low-resistance portions 43.

Figure 6D:
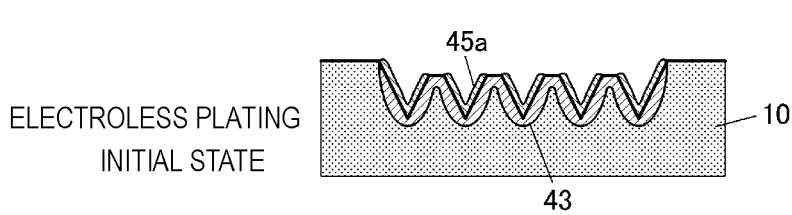

FIG. 6D illustrates the initial state of electroless plating performed on the ceramic body 10, to which the catalytic metal 46 has adhered, by immersing the ceramic body 10 in a plating solution containing a metal ion that forms an electrode. Since the catalytic metal 46 that serves as a precipitation core of a plating metal has adhered to the low-resistance portions 43 of the ceramic body 10, the plating metal portions 45a are reduced and precipitated onto the low-resistance portions 43 by the catalytic action of the catalytic metal 46, and the plating layers 45a are selectively formed on the low-resistance portions 43. The catalytic metal 46 serves as a precipitation core of the plating metal, and the plating metal portions 45a are reduced and precipitated onto the surfaces of the low-resistance portions 43. Portions of the plated electrodes 45a are located substantially close to one another, and thus, the adjacent portions of the plated electrodes 45a are promptly connected to each other.

Figure 6E:
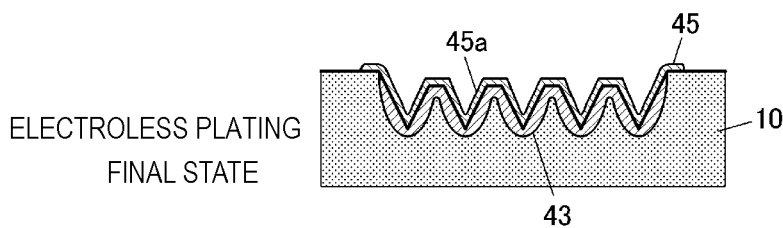

FIG. 6E illustrates the final stage of the electroless plating that has been performed. The continuous electrode 45 is formed in a shorter time than in a case where the laser is radiated onto positions that are spaced apart from one another as illustrated in FIGS. 4A-4E.

When the laser L is densely radiated onto the electrode-formation region as illustrated in FIGS. 6A-6E, the laser-irradiated marks 40 are also densely formed, and thus, the surfaces of the ceramic body 10 are shaved. Since the plating metal portions 45 are formed on these surfaces, the surfaces of the electrodes can each be positioned approximately at the same height as a corresponding one of the surfaces of the ceramic body 10 or can each be positioned lower than the corresponding surface of the ceramic body 10. Therefore, combined with the fact that the thicknesses of the electrodes are small, the amount of projection of each of the electrodes can be reduced, and a chip component that is further reduced in size can be fabricated.

Figure 7A:
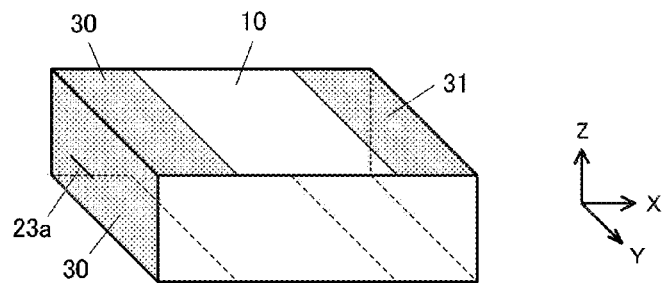
FIGS. 7A-7C are perspective views illustrating several ceramic electronic components according to other embodiments of the present disclosure.
Figure 7B:
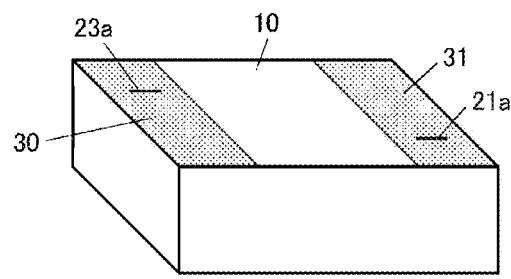
Figure 7C:
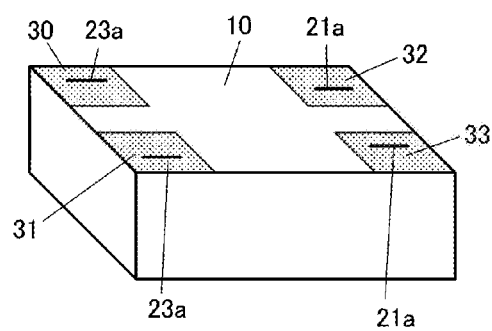

FIGS. 7A-7C illustrate several arrangements of electrodes of a chip component that is formed by using the method according to the present disclosure. In FIG. 7A, the outer electrodes 30 and 31 each having a U-shape are formed on the opposite end portions of the ceramic body 10. As in the embodiment illustrated in FIG. 1, the extended portions 21a and 23a of the inner electrode (the extended portion 21a is not illustrated) are exposed at the opposite end surface of the ceramic body 10 in the X direction, and each of the extended portions 21a and 23a is connected to one of the outer electrodes 30 and 31. In this case, each of the outer electrodes 30 and 31 is formed on a portion of one of the end surfaces of the ceramic body 10 in the X direction and on portions of the top and bottom surfaces of the ceramic body 10 (the two side surfaces of the ceramic body 10 in the Z direction), and no outer electrode is formed on the two side surfaces of the ceramic body 10 in the Y direction. Thus, the electronic components can be densely mounted so as to be adjacent to each other in the Y direction.

In FIG. 7B, the outer electrodes 30 and 31 are formed only on opposite end portions of the top surface (which becomes the bottom surface at the time of mounting the ceramic body 10) of the ceramic body 10. No outer electrode is formed on the other surfaces. In this case, the end portions 21a and 23a of the inner electrode are not exposed at the two end surfaces of the ceramic body 10 in the X direction and are exposed only at the top surface of the ceramic body 10 so as to be parallel to the X direction. The outer electrodes 30 and 31 are respectively connected to the end portions 23a and 21a of the inner electrode. In this case, the insulator layers included in the ceramic body 10 are laminated together not in the Z direction but in the Y direction. Since the outer electrodes are formed only on the bottom surface of the ceramic body 10, an electronic component that is suitable for high-density mounting can be fabricated.

In FIG. 7C, for example, four outer electrodes 30 to 33 are formed on opposite end portions of the top surface (which becomes the bottom surface at the time of mounting the ceramic body 10) of the ceramic body 10 in the X direction. Also in this case, the end portions (not illustrated) of the inner electrode are not exposed at the end surfaces of the ceramic body 10 in the X direction and are exposed only at the top surface of the ceramic body 10, on which the outer electrodes 30 to 33 are formed. As described above, there is no limitation on forming outer electrodes by using the method according to the present disclosure as long as each of the outer electrodes is formed on a surface on which laser processing can be performed, and the outer electrodes can be formed at arbitrary positions.

Figure 8:
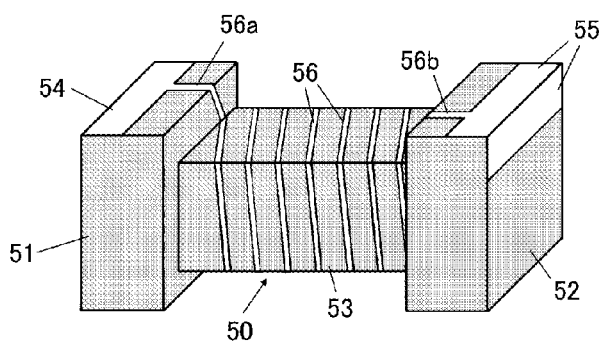
FIG. 8 is a perspective view illustrating a wire-wound inductor that is an example of the ceramic electronic component according to the present disclosure.

FIG. 8 illustrates a case in which the present disclosure is applied to formation of electrodes of a wire-wound inductor. A ceramic body 50 is a core that includes flange portions 51 and 52 formed at the opposite ends thereof and a winding core portion 53 formed between the flange portions 51 and 52. As a core material, for example, Ni—Zn-based ferrite, Ni—Cu—Zn-based ferrite, or the like can be used. Low-resistance portions are formed by laser processing in outer-electrode-formation regions of the top surfaces and end surfaces of the flange portions 51 and 52 of the core 50, and outer electrodes 54 and 55 are formed on the low-resistance portions by plating. In addition, a coil-shaped low-resistance portion is formed on the peripheral surface of the winding core portion 53 by laser processing, and a coil electrode 56 is formed on the coil-shaped low-resistance portion by plating. The laser processing is performed such that the two ends of the coil-shaped low-resistance portion are continuous with the low-resistance portions formed in the outer-electrode-formation regions, and thus, two ends 56a and 56b of the coil electrode 56 are respectively connected to the outer electrodes 54 and 55 by plating.

In the present embodiment, the coil-shaped low-resistance portion and the low-resistance portions for the outer electrodes can be formed so as to be continuous with one another by laser processing. As the laser processing, for example, a method can be employed in which laser is set to be radiated onto a fixed position and in which the core 50 is rotated and moved in an axial direction. The coil electrode 56 and the outer electrodes 54 and 55 can be simultaneously formed by plating, and thus, the efficiency of a process of manufacturing the inductor can be improved, and the manufacturing cost can be reduced. Note that the coil electrode 56 and the outer electrodes 54 and 55 can each have a multilayer structure by performing plating thereon several times.

As described above, when the coil electrode 56 and the outer electrodes 54 and 55 are formed by the same laser processing and the same plating, there is a possibility that the electrodes 56, 54, and 55 will have a substantially uniform thickness. In particular, if it is desired to increase the magnetic flux generated by the coil electrode 56, it is desirable to set the thickness of the coil electrode 56 to be larger than the thickness of each of the outer electrodes 54 and 55. In this case, for example, the intensity of the laser that is radiated onto the winding core portion 53 may be set to be higher than the intensity of the laser that is radiated onto each of the outer electrode regions, and the method of radiating laser onto the winding core portion 53 and the method of radiating laser onto each of the outer electrode regions (e.g., intermittent radiation, continuous radiation, or expansion and contraction of irradiation range) may be changed. By increasing the intensity of laser, there is a possibility that the resistance of the coil-shaped low-resistance portion will be lower than the resistance of each of the low-resistance portions in the outer-electrode-formation regions or that the depth of the coil-shaped low-resistance portion will be larger than the depth of each of the low-resistance portions in the outer-electrode-formation regions. As a result, the thickness of the electrode 56, which is formed on the coil-shaped low-resistance portion by plating, can be set to be larger than the thickness of each of the electrodes 54 and 55, which are formed on the low-resistance portions in the outer-electrode-formation regions.

Figure 9:
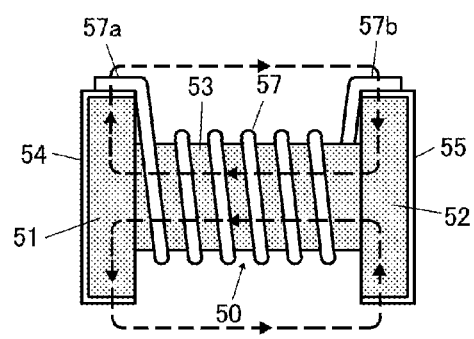
FIG. 9 is a side view illustrating another example of the wire-wound inductor according to the present disclosure.

FIG. 9 illustrates another application of the wire-wound inductor. Portions that are the same as the portions illustrated in FIG. 8 are denoted by the same reference signs, and repeated descriptions will be omitted. In the present embodiment, unlike the wire-wound inductor illustrated in FIG. 8, a wire 57 is wound around the winding core portion 53, and only the outer electrodes 54 and 55 that are connected to the wire 57 are formed by plating. In other words, low-resistance portions are formed by laser processing in outer-electrode-formation regions of the top surfaces, the outer side surfaces, and the bottom surfaces of the flange portions 51 and 52 of the ferrite core 50, and the outer electrodes 54 and 55 are formed on the low-resistance portions by plating. Thus, in the present embodiment, the outer electrodes 54 and 55 each of which has a U-shape when seen as a whole are formed. The wire 57 is wound around the peripheral surface of the winding core portion 53, and two ends 57a and 57b of the wire 57 are respectively connected to a portion of the outer electrode 54, which is formed on the top surface of the flange portion 51, and a portion of the outer electrode 55, which is formed on the top surface of the flange portion 52. Portions of the outer electrodes 54 and 55 that are formed on the bottom surfaces of the flange portions 51 and 52 are also used as mounting electrodes. Note that the shape of each of the outer electrodes 54 and 55 is not limited to a U-shape, and the outer electrodes 54 and 55 may be formed only on, for example, the top surfaces (connecting surfaces for the wire 57) of the flange portions 51 and 52. Although FIG. 9 illustrates an example of a coil component in which a single wire is used, two wires may be used. In this case, two outer electrodes may be formed on each of the flange portions 51 and 52.

In the present embodiment, each of the outer electrodes 54 and 55 can be formed to be thinner than the wire 57, and this provides an effect of reducing an eddy-current loss. In other words, as a result of the magnetic flux generated by the wire 57 (indicated by dashed arrows in FIG. 9) being linked with the outer electrodes 54 and 55, an eddy-current loss is generated, and the eddy-current loss is proportional to the square of the thickness of each of the linked outer electrodes 54 and 55. The outer electrodes 54 and 55 that are formed by the method according to the present disclosure can each be formed to be thinner than a common outer electrode, and thus, the eddy-current loss can be reduced. In addition, if the wire 57 is used as a coil unit, the density of the magnetic flux that is generated increases, and thus, an inductor having a high Q-value can be obtained.

Figure 10:
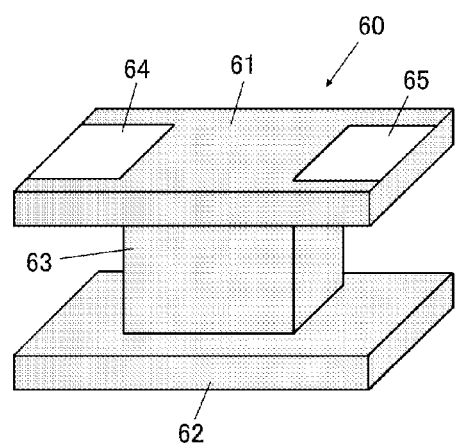
FIG. 10 is a perspective view illustrating a vertically-wound coil component that is an example of the ceramic electronic component according to the present disclosure.

FIG. 10 illustrates another case in which the present disclosure is applied to a vertically-wound coil component (an inductor). A ceramic body 60 in this case is a ferrite core that includes flange portions 61 and 62 formed at the opposite ends thereof and a winding core portion 63 formed between the flange portions 61 and 62. For example, two low-resistance portions are formed on the top surface of the flange portion 61 of the core 60 by laser processing or the like, and outer electrodes 64 and 65 are formed on the low-resistance portions by plating. Each of the outer electrodes 64 and 65 may be continuously formed on the top surface and a side surface of the flange portion 61. No outer electrode is formed on the flange portion 62. A coated wire (not illustrated) is wound around the peripheral surface of the winding core portion 63, and the two ends of the coated wire are each connected to one of the outer electrodes 64 and 65. Note that, although FIG. 10 illustrates an example of a coil component in which a single wire is used, two wires may be used. In this case, four outer electrodes may be formed on the flange portion 61.

In the cases illustrated in FIG. 1 to FIG. 3C, and FIG. 7A to FIG. 10, although the present disclosure is applied to formation of outer electrodes of a multilayer inductor and formation of electrodes of a wire-wound inductor (a ferrite core), the present disclosure is not limited to these cases. A ceramic electronic component to which the present disclosure may be applied is not limited to an inductor, and the present disclosure can be applied to any electronic component as long as a ceramic body in which a low-resistance portion altered by local heating using laser radiation, electron-beam radiation, or an image furnace can be formed is used in the electronic component. In other words, the material of the ceramic body is not limited to ferrite.

Figure 11:
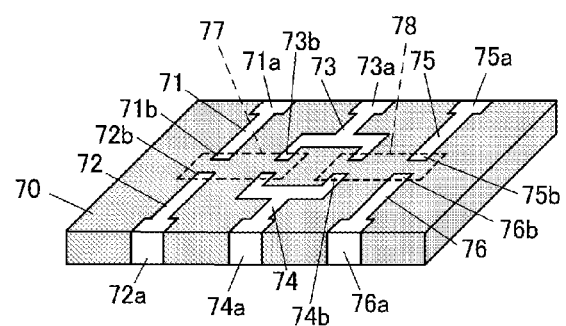
FIG. 11 is a perspective view illustrating a ceramic wiring board that is an example of the ceramic electronic component according to the present disclosure.

FIG. 11 illustrates a case in which the present disclosure is applied to a wiring board 70. The wiring board 70 is formed of a ceramic body made of, for example, ferrite, and wiring electrodes 71 to 76 are formed on the top surface of the wiring board 70. Outer end portions 71a to 76a of the wiring electrodes 71 to 76 also extend to side surfaces of two opposing sides of the wiring board 70. Inner end portions 71b to 76b of the wiring electrodes 71 to 76 are arranged so as to be close to one another, and electronic components 77 and 78 can be mounted between these inner end portions 71b to 76b. Note that FIG. 11 illustrates a simple example of the patterns of the wiring electrodes 71 to 76, and the patterns of the wiring electrodes 71 to 76 may be arbitrarily changed. In addition, through-hole electrodes may be formed in or between the inner end portions 71b to 76b of the wiring electrodes 71 to 76.

The technique according to the present disclosure in which local heating, catalyst application, and electroless plating are performed in this order can be employed also when the wiring electrodes 71 to 76 of the wiring board 70, which have been described above, are formed. In particular, when laser is used as a method of performing local heating, a highly accurate circuit pattern can be formed without performing special patterning processing.

Note that the entire wiring board 70 is not necessarily made of a ceramic material that contains a metal oxide such as ferrite, and it is only necessary that at least an outer-layer portion thereof on which an electrode is to be formed be made of a ceramic material that contains a metal oxide. Therefore, the wiring board 70 may be a composite substrate or a multilayer substrate that is made of a plurality of materials.

In the above-described embodiment, although laser radiation is employed as the local heating method, other heating methods using electron-beam radiation, an image furnace, and so forth can also be employed. In any of these cases, outer-electrode-formation regions of a ceramic body can be locally heated by converging the energy of a heat source, and thus, special patterning processing is not necessary.

In the present disclosure, a single laser beam may be divided into a plurality of laser beams, and the laser beams may be radiated onto a plurality of positions at the same time. In addition, in the present disclosure, the focal point of the laser may be defocused so as to expand the irradiation range of the laser to be wider than that when the laser is focused.

The present disclosure is not limited to a case in which, when a plurality of layers of a plating metal are formed, the lowermost layer of the plating metal is caused to grow so as to expand over the entire electrode-formation region. The lowermost layer of the plating metal may be caused to grow so as to expand to a portion of the electrode-formation region, and an upper layer of the plating metal may be caused to grow so as to expand over the entire electrode-formation region.

What is claimed is:

1. A method of manufacturing a ceramic electronic component, the method comprising:
   preparing a sintered ceramic body that contains a metal oxide;
   forming a low-resistance portion comprised of a plurality of regularly spaced marks that is formed by reducing a resistance of a portion of the ceramic body by performing local heating on an electrode-formation region of a surface of the ceramic body;
   causing a catalytic metal to adhere to the low-resistance portion by immersing the ceramic body, in which the low-resistance portion has been formed, in a catalytic metal substitution treatment solution; and forming a plating layer that serves as an electrode onto the low-resistance portion by performing electroless plating on the ceramic body to which the catalytic metal has adhered,
wherein the plating layer that serves as the electrode is a single continuous plating layer formed from the plurality of regularly spaced marks.

2. The method of manufacturing a ceramic electronic component according to claim 1,
wherein the local heating is any one of local heating using laser radiation, local heating using electron-beam radiation, and local heating using an image furnace.

3. The method of manufacturing a ceramic electronic component according to claim 2,
wherein the low-resistance portion includes a reduced layer that is formed as a result of a metal oxide contained in the ceramic body being partly reduced.

4. The method of manufacturing a ceramic electronic component according to claim 2,
wherein the catalytic metal substitution treatment solution is any one of a Pd substitution treatment solution, an Ag substitution treatment solution, and a Cu substitution treatment solution.

5. The method of manufacturing a ceramic electronic component according to claim 2, wherein
the ceramic electronic component is a chip component, and
an outer electrode is formed of the plating layer on an outer surface of the chip component.

6. The method of manufacturing a ceramic electronic component according to claim 2, wherein
the ceramic body is a ferrite core that includes flange portions that are formed at opposite ends of the ferrite core and a winding core portion that is formed between the flange portions, and
outer electrodes to which two end portions of a coil are connected are formed of the plating layer on the flange portions of the ferrite core.

7. The method of manufacturing a ceramic electronic component according to claim 2, wherein
the ceramic electronic component is a ceramic wiring board, and
a wiring electrode is formed of the plating layer on a surface of the ceramic wiring board.

8. The method of manufacturing a ceramic electronic component according to claim 1,
wherein the low-resistance portion includes a reduced layer that is formed as a result of a metal oxide contained in the ceramic body being partly reduced.

9. The method of manufacturing a ceramic electronic component according to claim 8, wherein
the ceramic body includes ferrite, and
the low-resistance portion includes a reduced layer that is formed as a result of a metal oxide contained in the ferrite being partly reduced.

10. The method of manufacturing a ceramic electronic component according to claim 4,
wherein the catalytic metal substitution treatment solution causes a catalytic metal to substitute for a metal that had been reduced from the metal oxide during forming the low-resistance portion in the reduced layer.

11. The method of manufacturing a ceramic electronic component according to claim 4,
wherein the catalytic metal substitution treatment solution is any one of a Pd substitution treatment solution, an Ag substitution treatment solution, and a Cu substitution treatment solution.

12. The method of manufacturing a ceramic electronic component according to claim 8,
wherein the catalytic metal substitution treatment solution causes a catalytic metal to substitute for a metal that had been reduced from a corresponding metal oxide during forming the low-resistance portion in the reduced layer.

13. The method of manufacturing a ceramic electronic component according to claim 8,
wherein the catalytic metal substitution treatment solution is any one of a Pd substitution treatment solution, an Ag substitution treatment solution, and a Cu substitution treatment solution.

14. The method of manufacturing a ceramic electronic component according to claim 8, wherein
the ceramic electronic component is a chip component, and
an outer electrode is formed of the plating layer on an outer surface of the chip component.

15. The method of manufacturing a ceramic electronic component according to claim 8, wherein
the ceramic body is a ferrite core that includes flange portions that are formed at opposite ends of the ferrite core and a winding core portion that is formed between the flange portions, and
outer electrodes to which two end portions of a coil are connected are formed of the plating layer on the flange portions of the ferrite core.

16. The method of manufacturing a ceramic electronic component according to claim 8, wherein
the ceramic electronic component is a ceramic wiring board, and
a wiring electrode is formed of the plating layer on a surface of the ceramic wiring board.

17. The method of manufacturing a ceramic electronic component according to claim 1,
wherein the catalytic metal substitution treatment solution is any one of a Pd substitution treatment solution, an Ag substitution treatment solution, and a Cu substitution treatment solution.

18. The method of manufacturing a ceramic electronic component according to claim 1, wherein
the ceramic electronic component is a chip component, and
an outer electrode is formed of the plating layer on an outer surface of the chip component.

19. The method of manufacturing a ceramic electronic component according to claim 1, wherein
the ceramic body is a ferrite core that includes flange portions that are formed at opposite ends of the ferrite core and a winding core portion that is formed between the flange portions, and
outer electrodes to which two end portions of a coil are connected are formed of the plating layer on the flange portions of the ferrite core.

20. The method of manufacturing a ceramic electronic component according to claim 1, wherein
the ceramic electronic component is a ceramic wiring board, and
a wiring electrode is formed of the plating layer on a surface of the ceramic wiring board.

* * * * *